United States Patent [19]
Han et al.

[11] Patent Number: 6,064,590
[45] Date of Patent: May 16, 2000

[54] NON-VOLATILE STATIC RANDOM ACCESS MEMORY DEVICE

[75] Inventors: Chul-Hi Han, Taejoin-si; Sung-Hoi Hur, Seoul, both of Rep. of Korea

[73] Assignee: Korea Advanced Institute of Science and Technology, Rep. of Korea

[21] Appl. No.: 09/130,801

[22] Filed: Aug. 7, 1998

[30] Foreign Application Priority Data

Dec. 9, 1997 [KR] Rep. of Korea ..................... 97-66889

[51] Int. Cl.[7] .................................................. G11C 16/04
[52] U.S. Cl. ............................. 365/185.01; 365/185.08; 365/156; 365/228; 711/162
[58] Field of Search ..................... 365/185.01, 185.08, 365/156, 228; 711/162

[56] References Cited

U.S. PATENT DOCUMENTS

| | | | |
|---|---|---|---|
| 4,300,212 | 11/1981 | Simko | 365/185 |
| 4,355,375 | 10/1982 | Arakawa | 365/185 |
| 4,965,828 | 10/1990 | Ergott, Jr. | 380/50 |
| 5,051,958 | 9/1991 | Arakawa | 365/228 |
| 5,189,641 | 2/1993 | Arakawa | 365/228 |

OTHER PUBLICATIONS

IEEE Journal of Solid–State CIrcuits, vol. 32, No. 6, Jun. 1997.
IEEE Journal of Solid–State Circuits, vol. SC–18, No. 5, Oct. 1983.

*Primary Examiner*—David Nelms
*Assistant Examiner*—Connie C. Yoha
*Attorney, Agent, or Firm*—Bachman & LaPointe, P.C.

[57] ABSTRACT

A non-volatile static random access memory device configured by adding a floating gate type metal oxide semiconductor device to an SRAM including a pair of access elements respectively switched on and off in accordance with the state of a signal on an address line and adapted to establish a data transfer path between memory cell and associated negative and positive data lines, and a pair of inverters respectively coupled to the access elements, thereby allowing the SRAM to exhibit non-volatile memory characteristics. The floating gate type MOS device has a silicon substrate, a tunneling oxide film formed over the silicon substrate, a floating gate formed on the tunneling oxide film, an oxide film formed over the floating gate, a control gate formed over the oxide film, and a source and a drain respectively formed in an upper surface of the silicon substrate at both sides of the control gate. The source and drain of the floating gate type MOS device are electrically connected at the source and drain thereof to the input terminals of the inverters of the SRAM, respectively, so that it provides non-volatile memory characteristics to the SRAM by virtue of a difference in threshold voltage caused by charge stored in the floating gate thereof. This non-volatile SRAM device has a high density while exhibiting high-speed operation characteristics.

14 Claims, 5 Drawing Sheets

NON-VOLATILE STATIC RANDOM ACCESS MEMORY DEVICE

BACKGROUND OF THE INVENTION

1. Field of the Invention

The present invention relates to static memories, and more particularly to a non-volatile static random access memory (SRAM) device configured by adding a metal oxide semiconductor (MOS) transistor having a floating gate to the memory cell region of an SRAM, thereby allowing the SRAM to exhibit non-volatile memory characteristics.

2. Description of the Prior Art

Recently, technical fields, with which computers are associated, have been developed to provide compact, high performance and high speed computers by virtue of developments in semiconductor technology. In particular, memories used in computers have been developed to provide an integration of an increased number of memory cells per unit area in order to achieve a compactness thereof.

Memories are mainly classified into those of a read only memory (ROM) type and those of a RAM type. ROM's are storage devices having characteristics of preventing data once recorded from being erased. Such ROM's are used to store permanently specific programs such as programs of operating systems. On the other hand, RAM's are storage devices having characteristics of allowing data to be stored and to be changed therefrom. Such RAM's are mainly used to temporarily store data generated during operations of operating systems. In order to achieve a high-speed system operation, it is required to use a RAM having a high access (read/write) speed. To this end, RAM's have a configuration including a set of memory cells each having a configuration illustrated in FIG. 1 or 2.

In the case of a SRAM shown in FIG. 1, the time taken to access data is short, thereby enabling a high-speed data processing, even though a degradation in density is involved because the unit cell of this SRAM consists of many elements.

On the other hand, in the case of a dynamic RAM (DRAM) shown in FIG. 2, there is an advantage in that a high density is obtained, as compared to the SRAM of FIG. 1. However, this DRAM needs to periodically refresh data, already stored, data given interval of time. This results in a large consumption of electric power.

Both the DRAM and SRAM have volatile characteristics, namely, a drawback, in that data stored disappears when the supply of drive voltage VDD is cut off. For this reason, non-volatile memories, such as electrically erasable and programmable ROM's (EEPROM's) and flash memories, having the characteristics of both the ROM and RAM are used in electronic appliances and elements for specific applications. However, such non-volatile memories are limitedly used because they have a drawback in that a lengthened time is taken to erase data stored or to write new data, even though data stored is kept in spite of a cut-off of electric power.

To this end, system designers should take into consideration characteristics of memories used in those systems. In the case of computer systems, however, an occasion that data disappears during its processing occurs frequently due to power failure or other reasons. In order to solve this problem, incorporation of an uninterrupted power supply in computer systems has been proposed. However, this results in an increase in the costs.

A number of schemes have been proposed to take the advantages of both the volatile and non-volatile memories, thereby eliminating the above mentioned problems. One scheme is to add a non-volatile memory to a static memory device, thereby allowing the static memory device to have non-volatile characteristics (Reference: Non-volatile Semiconductor Memory with SCRAM Hold Cycle Prior to SCRAM-to-EEPROM Backup Transfer, U.S. Pat. No. 4,965,828)

As apparent from the patent, however, such a memory device has problems such as a low data transfer rate and a low integration degree because the memory device is a simple combination of a static memory device with a non-volatile memory element.

Another scheme is to add a non-volatile memory element and a switch element to a static memory device, thereby allowing the static memory device to have non-volatile characteristics (Reference: IEEE J. Solid State Circuits, Vol. 18, No. 5, D. J. Lee, N. J. Becker and et al., pp. 525–531, Oct. 1983). However, this memory device is also problematic in that its density is low due to a large memory area additionally required. Furthermore, the memory device has a structure having a poor symmetry, thereby resulting in a degradation in the data keeping ability thereof.

Another scheme is to add a planar non-volatile memory element to a static memory device having a conventional configuration, along with switch elements adapted to switch the planar non-volatile memory element, thereby allowing the static memory device to have non-volatile characteristics (Reference: IEEE J. Solid State Circuits, Vol. 32, No. 6, P. J. Wright and R. U. Madurawe, pp. 918–919, June 1997). However, this memory device is also problematic in that its density is low due to a large memory area additionally required. Furthermore, the memory device exhibits a poor symmetry. Since the additional elements may operate during an operation of the static memory device, they may affect adversely the performance of the entire device.

SUMMARY OF THE INVENTION

Therefore, an object of the invention is to eliminate the above mentioned problems involved in the prior art and to provide a non-volatile SRAM device configured by adding a transistor having a floating gate to the memory cell region of a SRAM, thereby allowing the SRAM to have non-volatile memory characteristics while exhibiting a high data processing speed and a high density.

In accordance with the present invention, this object is accomplished by providing a non-volatile SRAM device comprising: a SRAM including a pair of access elements respectively switched on and off in accordance with the state of a signal on an address line and adapted to establish a data transfer path between an associated memory cell and associated negative and positive data lines, and a pair of inverters respectively coupled to the access elements, each of the inverters consisting of a load element and a drive element and having input and output terminals coupled to each other; and a floating gate type MOS device having a silicon substrate, a tunneling oxide film formed over the silicon substrate, a floating gate formed on the tunneling oxide film, an oxide film formed over the floating gate, a control gate formed over the oxide film, and a source and a drain respectively formed in an upper surface of the silicon substrate at both sides of the control gate, the floating gate type MOS device whose source and drain are electrically connected to the input terminals of the inverters of the SRAM, respectively, so that it provides non-volatile memory characteristics to the SRAM by virtue of a difference in threshold voltage caused by a charge stored in the floating gate thereof.

The control gate of the floating gate type MOS device may extend beyond the floating gate so that the floating gate type MOS device has a channel divided into two regions, one channel region being formed in a region of the silicon substrate, on which only the control gate is disposed, with the other channel region being formed in a region of the silicon substrate on which both the floating gate and the control gate are disposed.

Alternatively, the floating gate of the floating gate type MOS device may be split into two seperate ones regions. In this case, the control gate of the floating gate type MOS device overlaps completely with the two split floating gates.

The silicon substrate of the floating gate type MOS device may be made of a single-crystalline silicon.

Alternatively, the silicon substrate may be made of a poly-crystalline silicon.

The floating gate type MOS device may be an n type MOS device having a source and a drain both doped with n type impurity ions.

Alternatively, the floating gate type MOS device may be a p type MOS device having a source and a drain both doped with p type impurity ions.

The floating gate type MOS device serves to provide non-volatile characteristics to the SRAM by virtue of a difference in capacitance caused by the difference in the threshold voltage.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
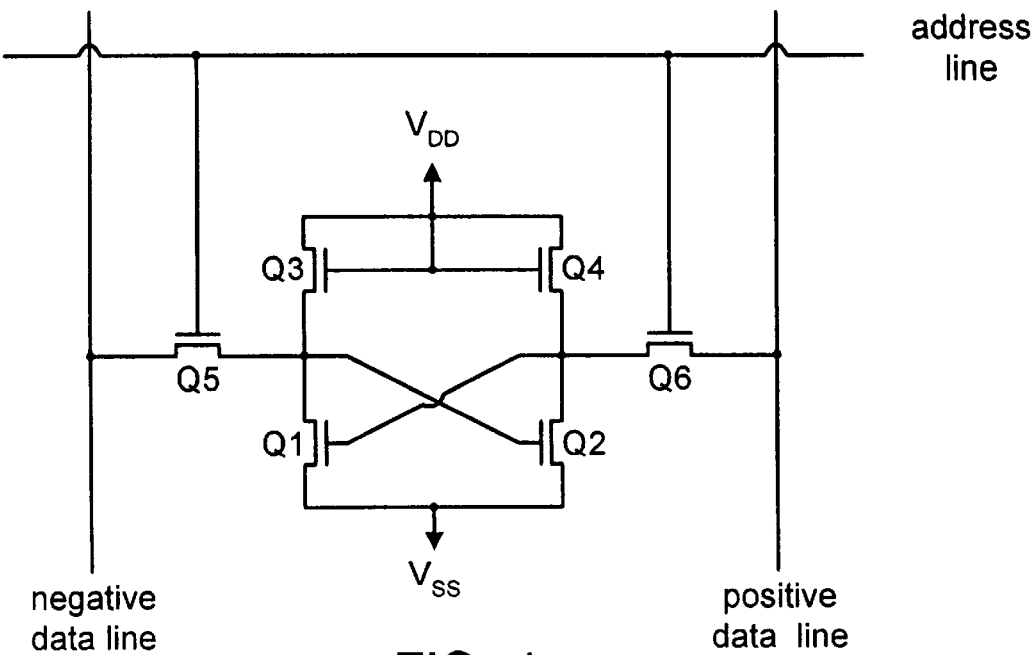
FIG. 1 is an equivalent circuit diagram of a general SRAM device.
Figure 2:
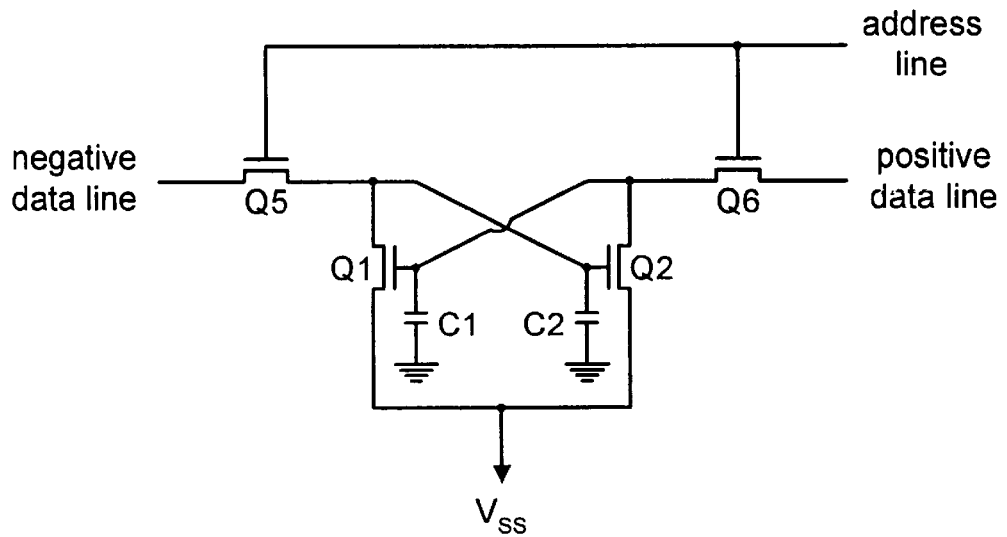
FIG. 2 is an equivalent circuit diagram of a general DRAM device.
Figure 3:
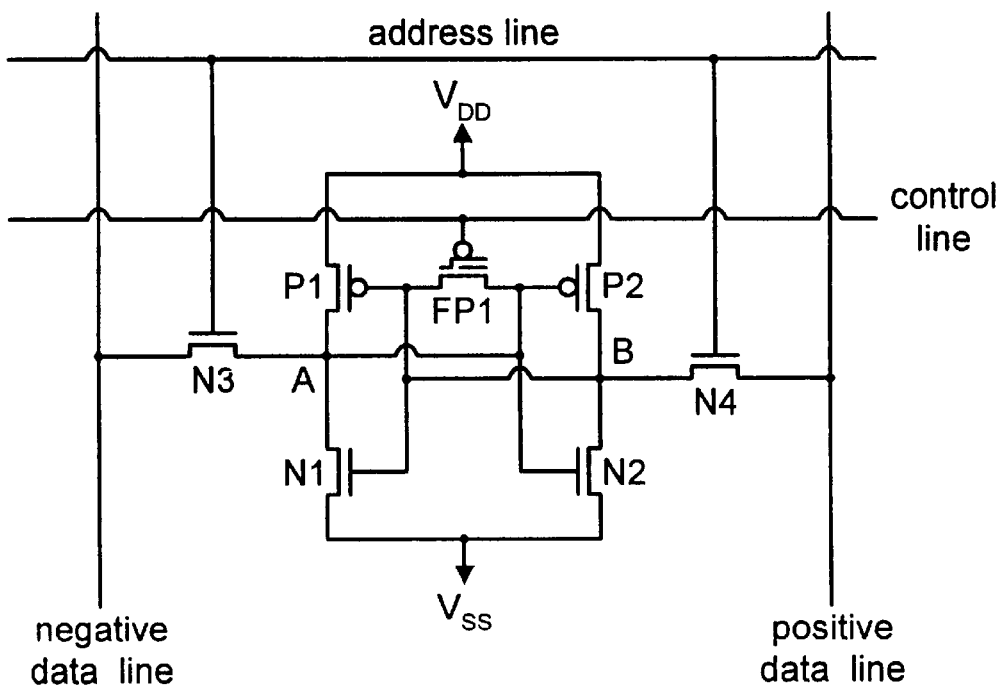
FIG. 3 is a circuit diagram illustrating a non-volatile SRAM device including a non-volatile memory device having a p-type channel in accordance with an embodiment of the present invention.

Referring to FIG. 3, a non-volatile SRAM device according to an embodiment of the present invention is illustrated.

In the non-volatile SRAM device shown in FIG. 3, its configuration, except for a floating gate type MOS device FP1 and a control line coupled to the MOS device FP1, is the configuration of an SRAM which is identical to that used in general static memory devices. As shown in FIG. 3, the SRAM includes access elements N3 and N4 respectively switched on and off in accordance with the state of a signal on an address line and adapted to establish a data transfer path between an associated memory cell and associated negative and positive data lines. The SRAM also includes a pair of inverters each consisting of a load element P1 or P2 and a drive element N1 or N2. Each inverter has input and output terminals coupled to each other. In accordance with the present invention, the source and drain terminals of the floating gate type MOS device FP1 is electrically connected to the input terminals of the inverters included in the SRAM having the above mentioned configuration, respectively.

Now, the configuration of such a floating gate type MOS device and its operation characteristics will be described in conjunction with FIGS. 5 and 6.

Figure 5:
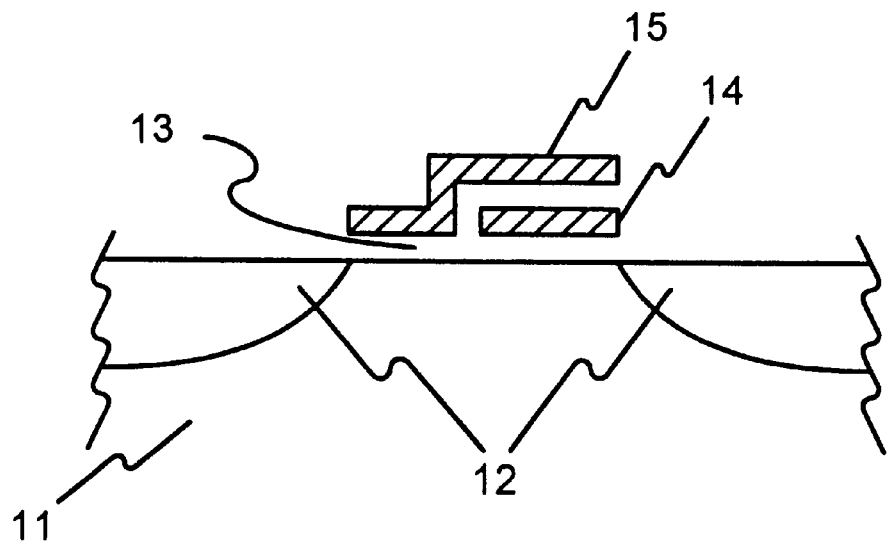
FIG. 5 is a cross-sectional view illustrating a floating gate type MOS device employed in the non-volatile SRAM device of FIG. 3 in accordance with an embodiment of the present invention, the MOS device having a single-crystalline substrate formed with an asymmetrical floating gate.

Referring to FIG. 5, a floating gate type MOS device, which is employed in accordance with an embodiment of the present invention, is illustrated. As shown in FIG. 5, the floating gate type MOS device includes a single-crystalline silicon substrate 11. A tunneling oxide film 13 is formed over the silicon substrate 11. A floating gate 14 is formed on a desired portion of the tunneling oxide film 13. A control gate 15 is also formed on the tunneling oxide film 13 in such a fashion that it extends over the floating gate 14. An oxide film is interposed between the floating gate 14 and the control gate 15. A pair of p-type impurity-doped regions 12 respectively serving as a source and a drain are formed in the upper surface of the silicon substrate 11 at both sides of the control gate 15. In this structure, the floating gate type MOS device has a channel divided into two regions. One channel is formed in a region of the silicon substrate 11 on which only the control gate 15 is disposed. The other channel is formed in a region of the silicon substrate 11 on which both the floating gate 14 and the control gate 15 are disposed.

In this floating gate type MOS device, when there is no charge stored in the floating gate 14, the channel, where only the control gate 15 is present, exhibits a threshold voltage less negative than that of the channel where both the floating gate 14 and the control gate 15 are present. When a negative (−) charge is stored in the floating gate 14, the channel, where both the floating gate 14 and the control gate 15 are present, decreases in threshold voltage, so that its threshold voltage becomes less negative than that of the channel where only the control gate 15 is present.

Accordingly, when a negative voltage is applied to the control gate 15 under the condition in which there is no charge stored in the floating gate 14, a positive (+) inversion charge is formed in the channel where only the control gate 15 is present.

On the contrary, if there is a negative charge stored in the floating gate 14, the channel, where both the floating gate 14 and the control gate 15 are present, is preferentially conducted, so that a positive inversion charge is formed in that channel.

Accordingly, an increase in capacitance occurs between the gate associated with the channel, where a positive charge is accumulated, and the associated source or drain 12.

Figure 6:
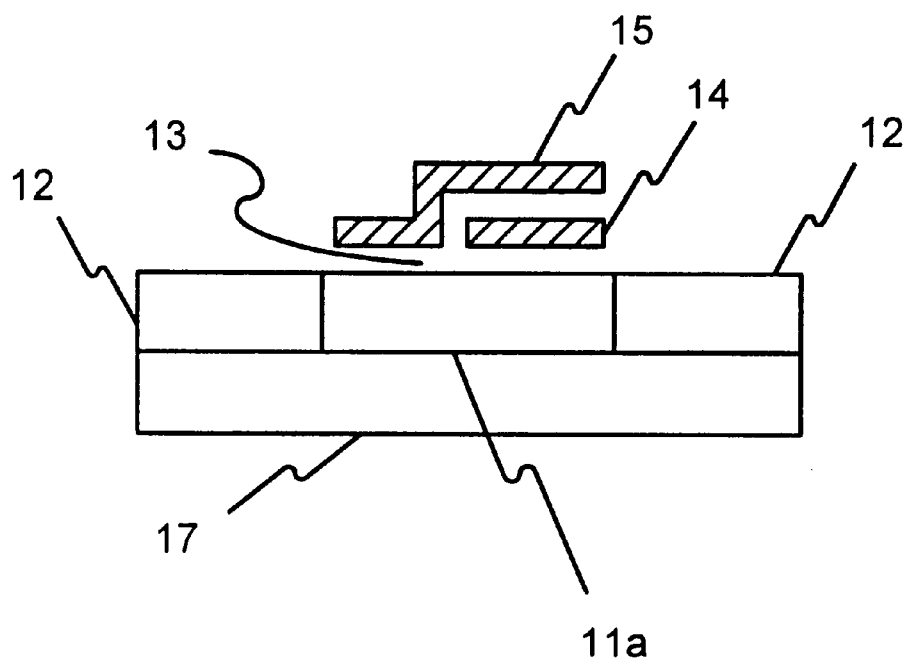
FIG. 6 is a cross-sectional view illustrating a floating gate type MOS device employed in the non-volatile SRAM device of FIG. 3 in accordance with another embodiment of the present invention, the MOS device having a poly-crystalline substrate formed with an asymmetrical floating gate.

Referring to FIG. 6, another floating gate type MOS device is illustrated. This floating gate type MOS device has the same structure except that a poly-crystalline silicon substrate 11a formed on an oxide film 17 is used in place of the single-crystalline silicon substrate 11 of FIG. 5.

Figure 4:
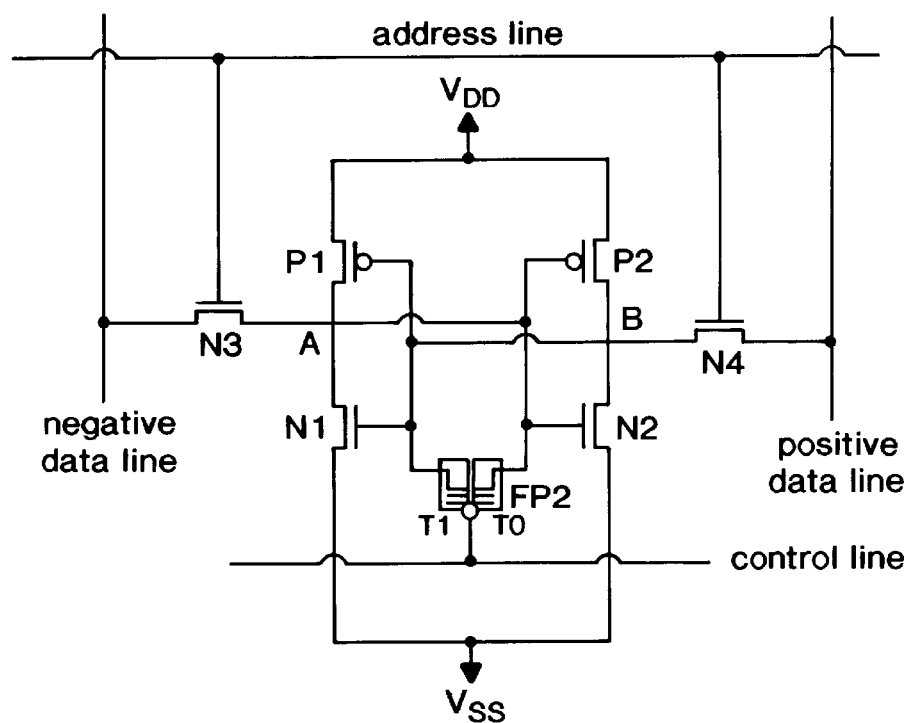
FIG. 4 is a circuit diagram illustrating a non-volatile SRAM device including a non-volatile memory device having an n type channel in accordance with another embodiment of the present invention.

On the other hand, FIG. 4 illustrates a non-volatile SRAM according to a preferred embodiment of the present invention. This non-volatile SRAM has the same configuration as that of FIG. 3 except that its floating gate type MOS device FP2 has a floating gate divided into two regions and has n-type impurity-doped source and drain.

The configuration of such a floating gate type MOS device employed in the non-volatile SRAM device of FIG. 4 and its operation characteristics will now be described in conjunction with FIGS. 7 and 8.

Figure 7:
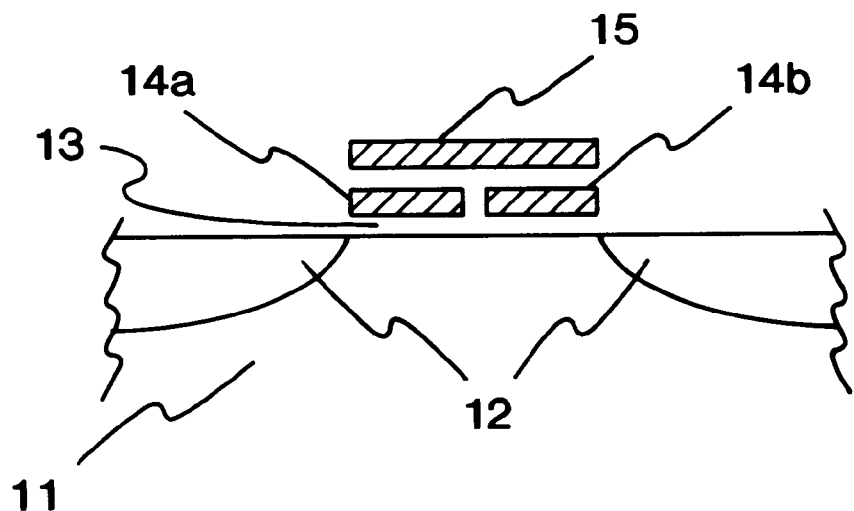
FIG. 7 is a cross-sectional view illustrating a floating gate type MOS device employed in the non-volatile SRAM device of FIG. 4 in accordance with an embodiment of the present invention, the MOS device having a polycrystalline substrate formed with a pair of separate floating gates.

Referring to FIG. 7, a floating gate type MOS device, which is employed in accordance with an embodiment of the present invention, is illustrated. As shown in FIG. 7, the floating gate type MOS device includes a single-crystalline silicon substrate 11. A tunneling oxide film 13 is formed on the silicon substrate 11. A pair of floating gates 14a and 14b isolated from each other are formed on the tunneling oxide film 13. A control gate 15 is also formed on the floating gates 14a and 14b. An oxide film is interposed between the floating gates and the control gate. A pair of n type impurity-doped regions 12 respectively serving as a source and a drain are formed in the upper surface of the silicon substrate 11 at both sides of the control gate.

In this floating gate type MOS device, an increase in threshold voltage occurs at the floating gate 14a or 14b where a negative charge is stored. When the positive voltage applied to the control gate 15 increases, electrons are preferentially accumulated in a channel under the floating gate, where no negative charge is stored, over a channel under to the floating gate where a negative charge is stored.

Figure 8:
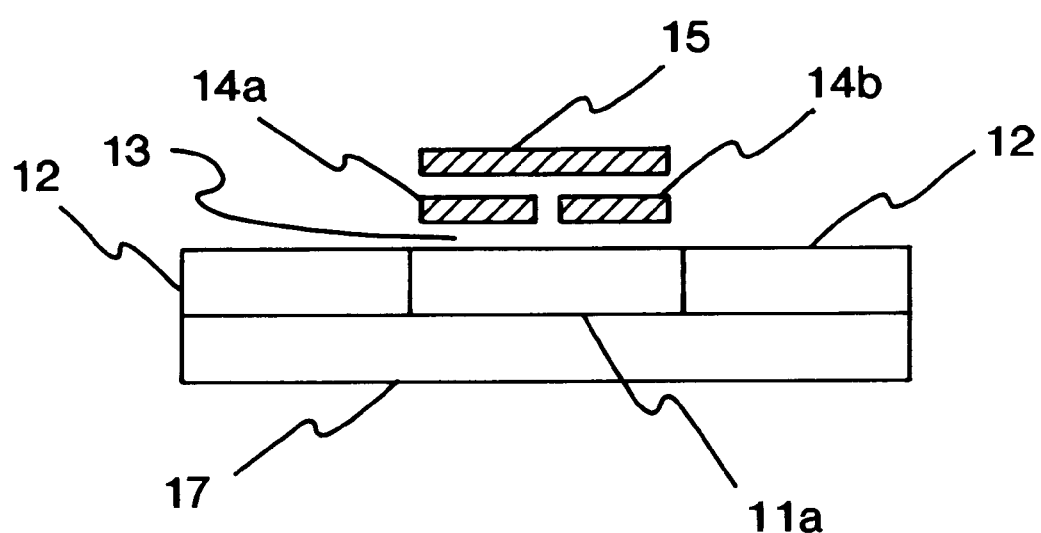
FIG. 8 is a cross-sectional view illustrating a floating gate type MOS device employed in the non-volatile SRAM device of FIG. 4 in accordance with another embodiment of the present invention, the MOS device having a poly-crystalline substrate formed with a pair of separate floating gates.

Referring to FIG. 8, another floating gate type MOS device is illustrated. This floating gate type MOS device has the same structure except that a poly-crystalline silicon substrate 11a formed on an oxide film 17 is used in place of the single-crystalline silicon substrate 11 of FIG. 7.

The non-volatile SRAM device of FIG. 3 employs the floating gate type MOS device shown in FIG. 5 or 6 whereas the non-volatile SRAM device of FIG. 4 employs the floating gate type MOS device shown in FIG. 7 or 8. These non-volatile SRAM devices operate in the same manner in that they utilize a difference in capacitance caused by a difference in threshold voltage. Accordingly, memory cell operations of these non-volatile SRAM devices will be described in conjunction with only FIGS. 4 and 7.

In a normal operation, the floating gate type MOS device FP2 maintains an OFF state thereof when voltage of a low level approximate to "zero" is applied to a control line to which the gate of the floating gate type MOS device FP2 is coupled. In this state, the remaining circuit part of the non-volatile SRAM device operates as a general SRAM.

Where the floating gate type MOS device FP2 includes two MOSFET's T0 and T1 respectively provided with the floating gates 14b and 14a, as shown in FIG. 4, if positive voltage of a high level is applied to the control line under the condition in which the node A of the SRAM coupled to the negative data line is in a high voltage level while the node B of the SRAM coupled to the positive data line is a low voltage level, electrons then are injected to the floating gate 14b of the MOSFET T0 by virtue of hot carrier generation.

In this state, however, there is no electron injected to the floating gate 14a of the MOSFET T1 even when positive voltage of a high level is applied to the control line.

Thus, electrons are injected to a selected one of the floating gates of the MOSFET's T0 and T1 in accordance with the potential levels of the nodes A and B.

On the other hand, when negative voltage of a high level is applied to the control line, electrons stored in the floating gate 14a or 14b are discharged through the tunneling oxide film 13 by virtue of a difference in voltage between floating gates 14a and 14b, and silicon substrate 11.

Figure 9:
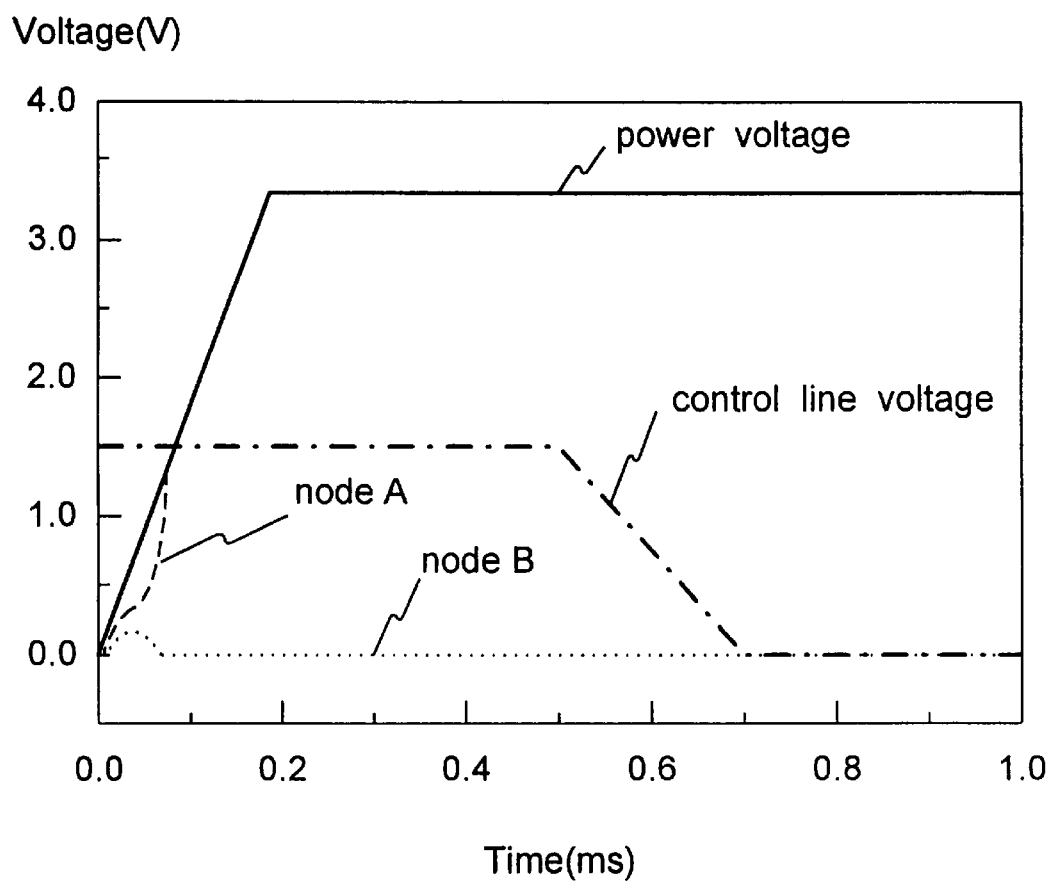
FIG. 9 is a waveform diagram illustrating a data restoring operation of the non-volatile SRAM device according to the present invention.

Now, a data restoring operation of the non-volatile SRAM device will be described in conjunction with the case, in which electrons are stored in the floating gate of the MOSFET T0 in the configuration of FIG. 4, while referring to FIGS. 4 and 9.

As the drive voltage VDD applied to the SRAM increases from "zero", the voltages at the source and drain 12 of the floating gate type MOS device FP2 (namely, respective voltages at the node A and B) increase correspondingly. When an increase in the voltage of the control line increases, the MOSFET of the floating gate type MOS device FP2 exhibiting a lower threshold voltage (this MOSFET is "T1" in the case wherein electrons are stored in the floating gate of the MOSFET T0) is preferentially conducted, so that an increase in capacitance occurs at the node B associated with this MOSFET. Due to this capacitance increase, the voltage increase proceeds slowly. In this state, the node, where capacitance increases, namely, the node B, decreases in voltage level in accordance with an operation of the SRAM whereas the voltage level of the other node exhibiting a high threshold voltage, namely, the node A, is rendered to be identical to the level of the drive voltage VDD. This is best shown in FIG. 9.

Accordingly, the nodes A and B are maintained in their voltage levels when data is stored, respectively. That is, the node A is maintained in a high voltage level whereas the node B is maintained in a low voltage level. Thus, it is possible to restore data.

In the case in which the node A is in a low voltage level whereas the node B is in a high voltage level, data storage and reproduction are carried out in the same manner as in the above mentioned case because the non-volatile SRAM device according to the present invention has a symmetrical circuit configuration as shown in FIG. 4.

In accordance with such a configuration, when power is supplied again after being cut off, data stored before the cut-off of power is restored.

As apparent from the above description, the present invention provides a non-volatile SRAM device configured by adding a non-volatile memory to an SRAM, thereby allowing the SRAM to exhibit non-volatile memory characteristics while having a high density. In accordance with the present invention, the non-volatile memory may share a source or drain region with the SRAM. In this case, accordingly, it is possible to achieve an enhanced improvement in the density. Since voltage of a high level is applied to only the control line of memory, the configuration of the present invention can be easily applied to existing designs.

Thus, the present invention enables fabrication of compact and high-performance non-volatile SRAM devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A non-volatile static random access memory (SRAM) device comprising:

a SRAM including a pair of access elements respectively switched on and off in accordance with the state of a signal on an address line and adapted to establish a data transfer path between memory cell and associated negative and positive data lines, and a pair of inverters respectively coupled to the access elements, each of the inverters consisting of a load element and a drive element and having input and output terminals coupled to each other; and a floating gate type metal oxide silicon (MOS) device having a silicon substrate, a tunneling oxide film formed over the silicon substrate, a floating gate formed on the tunneling oxide film, an oxide film formed over the floating gate, a control gate formed over the oxide film, and a source and a drain respectively formed in an upper surface of the silicon substrate at both sides of the control gate the source and drain of the floating gate type MOS device directly electrically connected at the source and drain thereof to the input terminals of the inverters of the SRAM, respectively, so that it provides non-volatile memory characteristics to the SRAM by virtue of a difference in threshold voltage caused by a charge stored in the floating gate thereof.

2. The non-volatile SRAM device according to claim 1, wherein the control gate of the floating gate type MOS device extends beyond the floating gate so that the floating gate type MOS device has a channel divided into two regions, one channel region being formed in a region of the silicon substrate, on which only the control gate is disposed, with the other channel region being formed in a region of the silicon substrate on which both the floating gate and the control gate are disposed.

3. The non-volatile SRAM device according to claim 1, wherein the floating gate of the floating gate type MOS device is split into two separate ones regions, and the control gate of the floating gate type MOS device overlaps with the two floating gates.

4. The non-volatile SRAM device according to claim 2, wherein the silicon substrate of the floating gate type MOS device is made of a single-crystalline silicon.

5. The non-volatile SRAM device according to claim 2, wherein the silicon substrate of the floating gate type MOS device is made of a poly-crystalline silicon.

6. The non-volatile SRAM device according to claim 2, wherein the floating gate type MOS device is an n type MOS device having a source and a drain both doped with n type impurity ions.

7. The non-volatile SRAM device according to claim 2, wherein the floating gate type MOS device is a p type MOS device having a source and a drain both doped with p type impurity ions.

8. The non-volatile SRAM device according to claims 1, wherein the floating gate type MOS device serves to provide non-volatile characteristics to the SRAM by virtue of a difference in capacitance caused by the difference in threshold voltage.

9. The non-volatile SRAM device according to claim 3, wherein the silicon substrate of the floating gate type MOS device is made of a single-crystalline silicon.

10. The non-volatile SRAM device according to claim 3, wherein the silicon substrate of the floating gate type MOS device is made of a poly-crystalline silicon.

11. The non-volatile SRAM device according to claim 3, wherein the floating gate type MOS device is an n type MOS device having a source and a drain both doped with n type impurity ions.

12. The non-volatile SRAM device according to claim 3, wherein the floating gate type MOS device is a p type MOS device having a source and a drain both doped with p type impurity ions.

13. The non-volatile SRAM device according to claim 2, wherein the floating gate type MOS device serves to provide non-volatile characteristics to the SRAM by virtue of a difference in capacitance caused by the difference in threshold voltage.

14. The non-volatile SRAM device according to claim 3, wherein the floating gate type MOS device serves to provide non-volatile characteristics to the SRAM by virtue of a difference in capacitance caused by the difference in threshold voltage.

* * * * *